US011119128B2

(12) United States Patent
Schweitzer, III et al.

(10) Patent No.: US 11,119,128 B2
(45) Date of Patent: Sep. 14, 2021

(54) LOOPBACK TESTING OF ELECTRIC POWER PROTECTION SYSTEMS

(71) Applicant: Schweitzer Engineering Laboratories, Inc., Pullman, WA (US)

(72) Inventors: Edmund O. Schweitzer, III, Pullman, WA (US); David E. Whitehead, Pullman, WA (US); Krishnanjan Gubba Ravikumar, Pullman, WA (US); Austin Edward Wade, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/919,896

(22) Filed: Jul. 2, 2020

(65) Prior Publication Data

US 2021/0109139 A1 Apr. 15, 2021

Related U.S. Application Data

(60) Provisional application No. 62/913,316, filed on Oct. 10, 2019.

(51) Int. Cl.
*G01R 19/25* (2006.01)
*H02J 13/00* (2006.01)
*G05B 23/02* (2006.01)

(52) U.S. Cl.
CPC ..... *G01R 19/2513* (2013.01); *G05B 23/0256* (2013.01); *H02J 13/00002* (2020.01); *H02J 13/00022* (2020.01)

(58) Field of Classification Search
CPC ............ G01R 19/2513; H02J 13/00002; H02J 13/00022; G05B 23/0256
See application file for complete search history.

(56) References Cited

U.S. PATENT DOCUMENTS

| 6,396,279 | B1 | 5/2002 | Gruenert |
| 6,608,493 | B2 | 8/2003 | Hensler |
| 6,795,789 | B2 | 9/2004 | Vandiver |
| 6,847,297 | B2 | 1/2005 | Lavoie |
| 6,892,115 | B2 | 5/2005 | Berkcan |
| 6,892,145 | B2 | 5/2005 | Topka |
| 6,909,942 | B2 | 6/2005 | Andarawis |
| 6,985,784 | B2 | 1/2006 | Vandevanter |
| 6,999,291 | B2 | 2/2006 | Andarawis |
| 7,012,421 | B2 | 3/2006 | Lavoie |

(Continued)

OTHER PUBLICATIONS

David Costello: Understanding and Analyzing Event Report Information, Oct. 2000.

(Continued)

*Primary Examiner* — Ziaul Karim
(74) *Attorney, Agent, or Firm* — Gregory C Baker; Richard M Edge

(57) ABSTRACT

Systems and methods to test an electric power delivery system include a communication subsystem to transmit test signals to one or more merging units, a test subsystem to transmit a test data stream to the one or more merging units via the communication subsystem, and a processor subsystem to receive looped back data from the one or more merging unit in response to the transmitted test data stream and to determine an operating condition based on the looped back data.

13 Claims, 9 Drawing Sheets

(56) References Cited

U.S. PATENT DOCUMENTS

| | | | |
|---|---|---|---|
| 7,043,340 | B2 | 5/2006 | Papallo |
| 7,058,481 | B2 | 6/2006 | Jiang |
| 7,058,482 | B2 | 6/2006 | Fletcher |
| 7,068,483 | B2 | 6/2006 | Papallo |
| 7,068,612 | B2 | 6/2006 | Berkcan |
| 7,111,195 | B2 | 9/2006 | Berkcan |
| 7,117,105 | B2 | 10/2006 | Premerlani |
| 7,151,329 | B2 | 12/2006 | Andarawis |
| 7,254,001 | B2 | 8/2007 | Papallo |
| 7,259,565 | B2 | 8/2007 | Diercks |
| 7,262,943 | B2 | 8/2007 | Stellato |
| 7,301,738 | B2 | 11/2007 | Pearlman |
| 7,460,590 | B2 | 12/2008 | Lee |
| 7,532,955 | B2 | 5/2009 | Dougherty |
| 7,636,616 | B2 | 12/2009 | Fletcher |
| 7,693,607 | B2 | 4/2010 | Kasztenny |
| 7,747,354 | B2 | 6/2010 | Papallo |
| 7,747,356 | B2 | 6/2010 | Andarawis |
| 7,986,503 | B2 | 7/2011 | Papallo |
| 8,024,494 | B2 | 10/2011 | Soed |
| 8,213,144 | B2 | 7/2012 | Papallo |
| 8,560,255 | B2 | 10/2013 | Elwarry |
| 8,891,963 | B2 | 11/2014 | Patel |
| 9,366,711 | B2 | 6/2016 | Klapper |
| 9,401,839 | B2 * | 7/2016 | Kidwell .................. H04L 69/08 |
| 9,632,147 | B2 | 4/2017 | Hensler |
| 9,819,611 | B2 | 11/2017 | Snowdon |
| 10,178,047 | B2 | 1/2019 | Chapman |
| 10,379,991 | B2 | 8/2019 | Yang |
| 10,740,253 | B2 * | 8/2020 | Sisler .................... H04L 67/08 |
| 2003/0048508 | A1 | 3/2003 | Yu |
| 2005/0030693 | A1 * | 2/2005 | Deak ................. G01R 31/3278 |
| | | | 361/160 |
| 2005/0143941 | A1 * | 6/2005 | Forth ................... G06Q 10/087 |
| | | | 702/61 |
| 2007/0067132 | A1 * | 3/2007 | Tziouvaras ............ H02H 7/261 |
| | | | 702/122 |
| 2009/0012728 | A1 | 1/2009 | Spanier |
| 2009/0296583 | A1 | 12/2009 | Dolezilek |
| 2010/0040068 | A1 | 2/2010 | Wimmer |
| 2010/0183298 | A1 | 7/2010 | Biegert |
| 2012/0137356 | A1 * | 5/2012 | Kim ...................... H04L 63/105 |
| | | | 726/11 |
| 2016/0013632 | A1 | 1/2016 | Lloyd |
| 2017/0026291 | A1 | 1/2017 | Smith |
| 2017/0163029 | A1 * | 6/2017 | Hong ................... H02H 7/263 |
| 2017/0288950 | A1 | 10/2017 | Manson |
| 2018/0034689 | A1 | 2/2018 | Kanabar |
| 2018/0089057 | A1 | 3/2018 | Yang |
| 2018/0348267 | A1 | 12/2018 | Yang |
| 2021/0083506 | A1 * | 3/2021 | Rao .......................... H02J 3/14 |

OTHER PUBLICATIONS

Joe Perez: A Guide to Digital Fault Recording Event Analysis, 2010.

Considerations for Use of Disturbance Recorders; a Report to the System Protection Subcommittee of the Power System Relaying Committee of the IEEE Power Engineering Society, Dec. 27, 2006.

David Costello: Event Analysis Tutorial, Part 1: Problem Statements 2011.

Jane Starck, Antti Hakala-Ranta, Martin Stefanka, Switchgear Optimization Using IEC 61850-9-2 and Non-Conventional Measurements May 23, 2012.

Will Allen, Tony Lee: Flexible High-Speed Load Shedding Using a Crosspoint Switch Oct. 2005.

Qiaoyin Yang, Rhett Smith: Improve Protection Communications Network Reliability Throught Software-Defined Process Bus, Jan. 2018.

Caitlin Martin, Steven Chase, Thanh-Xuan Nguyen, Dereje Jada Hawaz, Jeff Pope, Casper Labuschagne: Bus Protection Considerations for Various Bus Types; Oct. 2013.

* cited by examiner

US 11,119,128 B2

LOOPBACK TESTING OF ELECTRIC POWER PROTECTION SYSTEMS

RELATED APPLICATION

This application claims priority to U.S. Provisional Patent Application No. 62/913,316, filed Oct. 10, 2019, for "LOOPBACK TESTING OF ELECTRIC POWER PROTECTION SYSTEMS," the disclosure of which is hereby incorporated herein in its entirety by this reference.

TECHNICAL FIELD

This disclosure relates to a system for testing a primary protection device of an electric power delivery system. More particularly, this disclosure relates to merging units for selectively applying test signals to a protection relay under test to simulate disparate power system equipment and conditions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
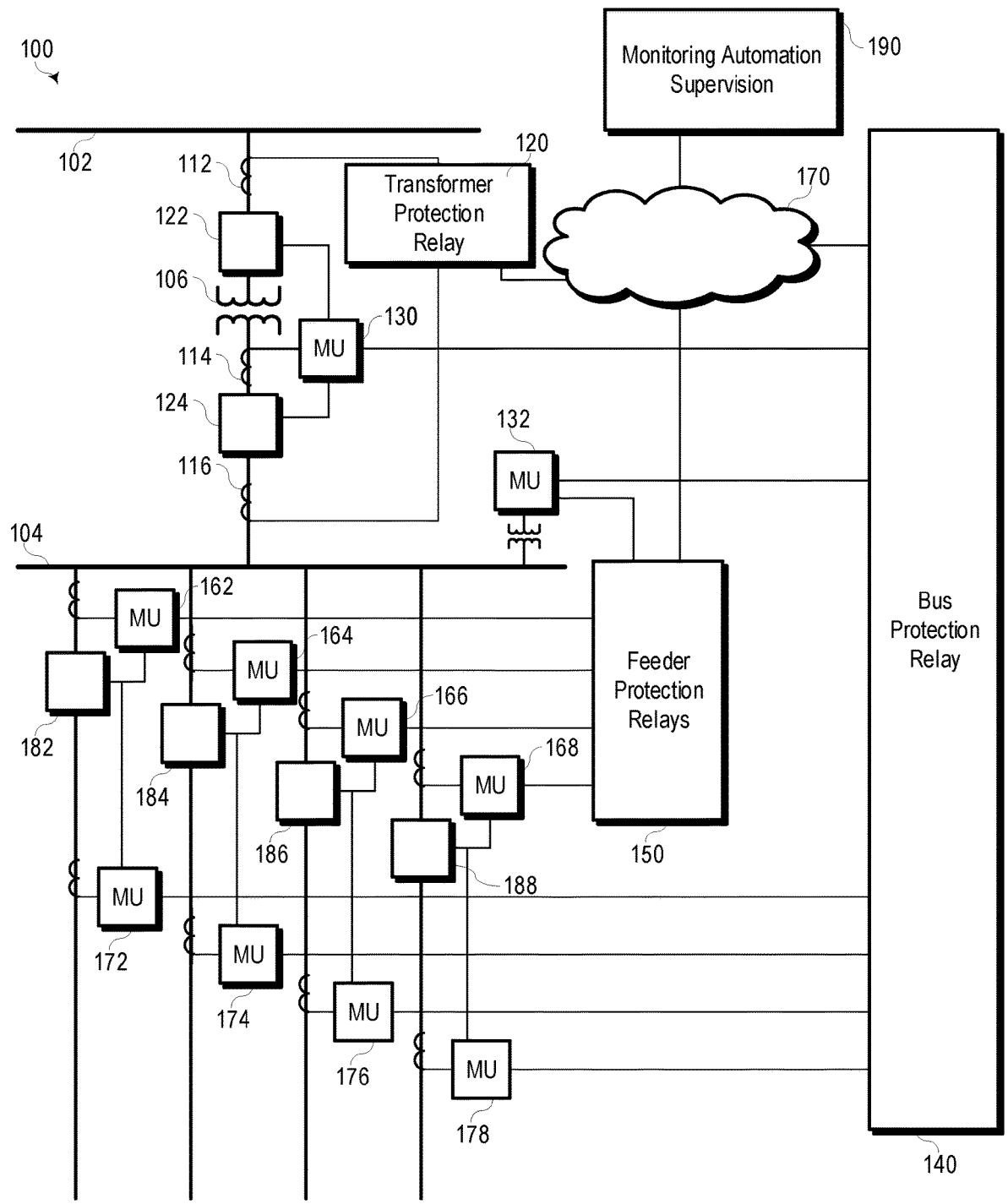
FIG. 1 illustrates a simplified one-line diagram of an electric power delivery system for providing electric power to loads including a system of traditional intelligent electronic devices (IEDs) and relays for protection and automation.

Electric power delivery systems are widely used to generate, transmit, and distribute electric power to loads, and serve as an important part of the critical infrastructure. Power systems and components are often monitored and protected by intelligent electronic devices (IEDs) and systems of IEDs that obtain electric power system information from the equipment and provide protective actions, monitor, and automate the power system. Several IEDs may be in communication to facilitate sharing of information for station-wide, area-wide, or even system-wide protection.

Modern electric power protection systems are integrated with automation, monitoring, and supervisory systems that rely on digital communication. IEDs perform numerous protection, automation, monitoring, and metering tasks that require proper settings and communications between IEDs and among IEDs and other devices. Such systems of IEDs are highly engineered for the proper functioning of the devices individually and the system as a whole. To ensure proper configuration, devices may be tested at the time of setting and commissioning, and thereafter as needed in accordance with a testing and maintenance schedule, as well as when devices or equipment are replaced or updated, and when new devices or equipment are added to the system. Testing of IEDs and systems of IEDs may require a significant amount of time and testing equipment and may require taking portions of the electric power delivery system and the system of IEDs out of service during the testing procedure.

In a test configuration, a test set may create and inject signals that are representative of conditions that may occur in an electric power delivery system. In response to such signals, the protective relay under test may implement various actions (e.g., opening a breaker, stepping up a voltage, connecting a capacitor bank, etc.). Proper function on the protective relay in response to tests may confirm that the relay will operate as expected when such conditions occur in the electric power system and ensure that the configuration of the relay is correct. Further, such testing may verify the wiring and operation of various elements (e.g., relay analog-to-digital (A/D) converters, etc.).

As will be discussed in more detail herein, one complication that may arise in the context of testing is the physical distance between devices under test. Devices that utilize rely on the same inputs may be spread across a substation yard or building. This separation may make testing setpoints from various protection tests difficult, requiring multiple test sets at various locations, and time synchronization of the various test sets.

Embodiments of the present disclosure include improved systems for testing electric power protection relays using test signals at a single location or from a single device. The embodiments described herein test signals from an integrator looped back to the primary protection relay under test using a merging unit. Thus, electric power delivery protection systems may be set, commissioned, and tested in relatively less time and with fewer resources.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer-executable code located within a memory device and/or transmitted as electronic signals over a system bus or wired or wireless network. In addition, data being tied or rendered together in a database record may be resident in the same memory device, or across several memory devices, and may be linked together in fields of a record in a database across a network. Embodiments may be provided as a computer program product including a non-transitory computer and/or machine-readable medium having stored thereon instructions that may be used to program a computer (or other electronic device) to perform processes described herein.

FIG. 1 illustrates a simplified one-line diagram of an electric power delivery system 100. It should be noted that the system 100 may include multiple phases and additional equipment and complexity. Also illustrated is a system of IEDs that obtain electric power system information from merging units (MUs), and effect control actions on the electric power system. The power system includes various equipment such as a bus 102 (illustrated as a transmission bus) providing electric power to a second bus 104 (illustrated as a distribution bus) via a transformer 106 for stepping down the power from a high (transmission) voltage to a lower (distribution) voltage. Various feeders extend from the second bus 104 for delivering electric power to distributed loads. Circuit breakers 122, 124, 182, 184, 186, 188 may be used to selectively connect and disconnect portions of the power system for various purposes such as reconfiguration, protection in the event of a fault, or the like.

A bus protection relay 140 may be an IED configured to determine operating conditions on a zone that includes the second bus 104 and provide signals to effect a protection operation upon determination of an adverse condition. IED 140 may obtain current signals related to electric power entering the bus 104 from MU 130, voltages from bus 104 using MU 132, and current signals related to electric power leaving bus 104 on the feeders from MUs 172, 174, 176, and 178. IED 140 may be configured to provide differential protection, overvoltage protection, and various other protection for a zone including the bus 104.

A feeder protection relay may be an IED 150 that obtains bus voltage signals from MU 132 and current signals related to the feeders from MUs 162, 164, 166, and 168. IED 150 may provide overcurrent, directional, distance, overfrequency, underfrequency, and other protection to the feeders. Feeder protection relays (e.g., IED 150) may communicate with bus protection relay 140 via network 170.

A transformer relay may be an IED 120 configured to provide protection to the transformer 106. IED 120 may obtain current signals from both sides of the transformer 106 from MUs or even directly from current transformers (CTs) 112 and 116. IED 120 may further provide information to IED 140 (e.g., via communications network 170). IED 120 may be configured to provide differential protection overcurrent protection, over frequency protection, underfrequency protection, and other various protection for the transformer 106.

MUs may be in communication with various circuit breakers 122, 124, 182, 184, 186, and 188 to provide signals to the circuit breakers and receive status information from the circuit breakers. Upon receiving an "open" signal from an IED, the MUs may be configured to signal-related circuit breakers to open. For example, upon detection of an overcurrent condition on the first feeder, IED 150 may be configured to signal MU 162 to open breaker 182 to remove current from the faulted feeder.

In various embodiments, the IEDs may be in communication with a monitoring, automation, or other supervisory system or device 190, such as a SCADA system. Such communications may be facilitated over communications network 170. Communications architecture as illustrated are highly engineered, and present multiple possible points of failure and attack. As mentioned above, a failure in communications or a cyber-attack on the system may affect the bus protection relay 140, feeder protection relay 150, or transformer relay 120 resulting in disruption of the protection of the power system.

Figure 2:
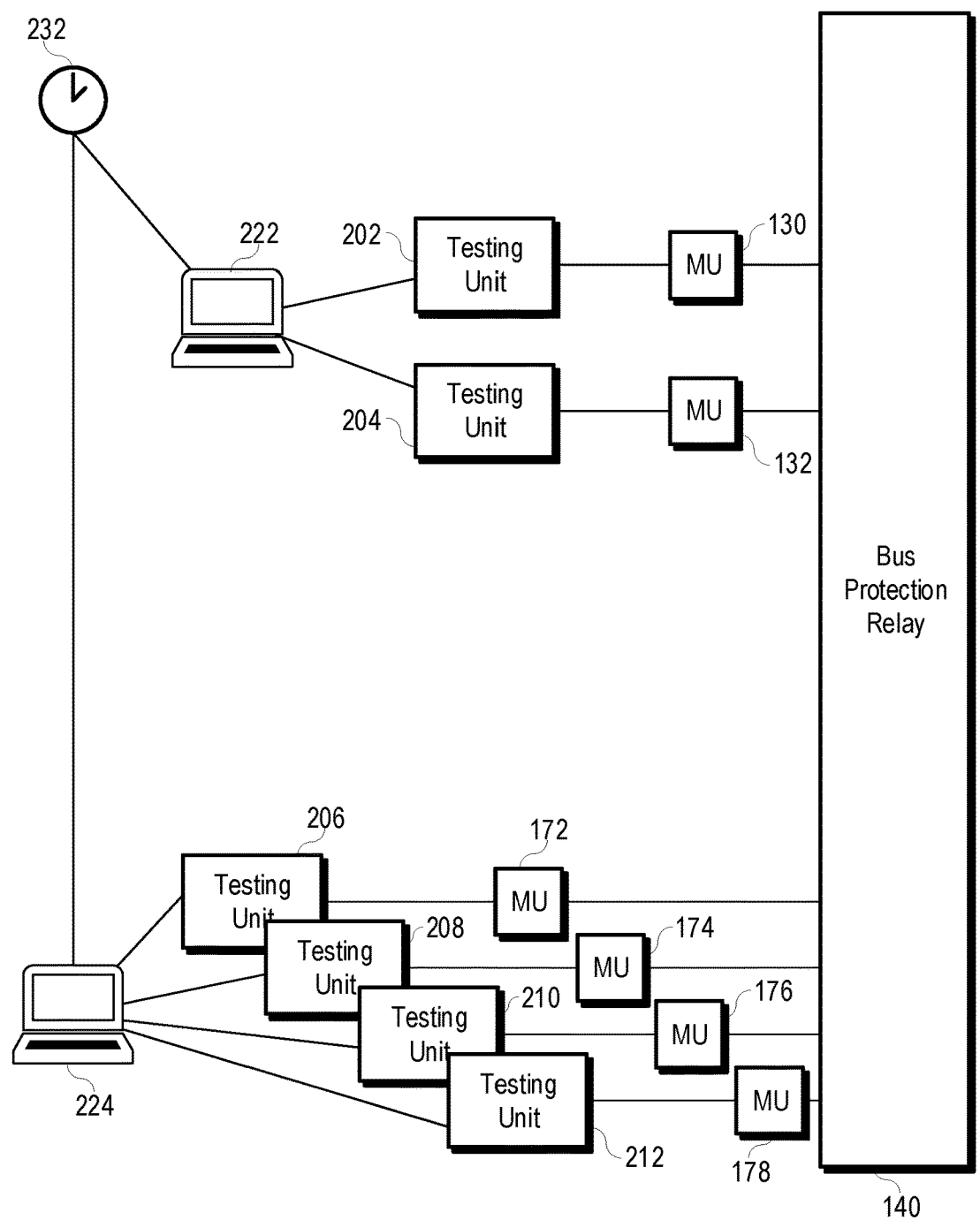
FIG. 2 illustrates a simplified block diagram for testing a bus protection relay in the electric power delivery system of FIG. 1.

FIG. 2 illustrates a simplified block diagram of a system for testing a device, such as the bus protection relay 140 of FIG. 1. The bus protection relay 140, may utilize current and/or voltage signals to perform differential protection and other operations within a zone of protection. In order to test the operations of the bus protection relay 140, known signals are injected into the merging units 130, 132, and 172-178, and the response from the bus protection relay 140 is monitored. In particular, the testing system includes a number of testing units 202, 204, 206, 208, 210, 212 configured to provide electrical signals to the merging units 130, 132, 172, 174, 176, 178; which in turn provide digitized analog signals corresponding with those electrical signals to the bus protection relay 140. Command outputs from the bus protection relay 140 are made to particular of the merging units, which in turn signal the corresponding testing unit.

Merging units are often located in the vicinity of the primary equipment, whereas the bus protection relay 140 is typically located in a control house. Further, primary equipment monitored by the bus protection relay 140 are often located some distance from each other, even on the order of thousands of feet. Accordingly, to inject signals into the subject merging units, either very long cables from a single testing unit, or, as illustrated, multiple testing units 202-212 located proximate to the subject merging units 130, 132, and 172-178 may be used. The testing units 202-212 may be controlled by one or more controllers 222, 224. With the distance between the testing units, multiple controllers 222, 224 may be used. Time-coordination of the injected signals may be used for proper testing of the protection functions of the bus protection relay 140. For the injected signals to be time coordinated, the controllers may receive a common time signal from a common time source 232.

As can be seen, for proper differential testing of a bus protection relay 140, several testing units, multiple controllers, and a common time source are needed. To perform the test, several merging units may be disconnected from the power system and connected to the testing units. With the number of devices and connections required for testing as illustrated, there is an increased likelihood of error. Embodiments of the present disclosure may include an improved system for protecting an electric power delivery system, and a testing system that requires less equipment and time.

Figure 3:
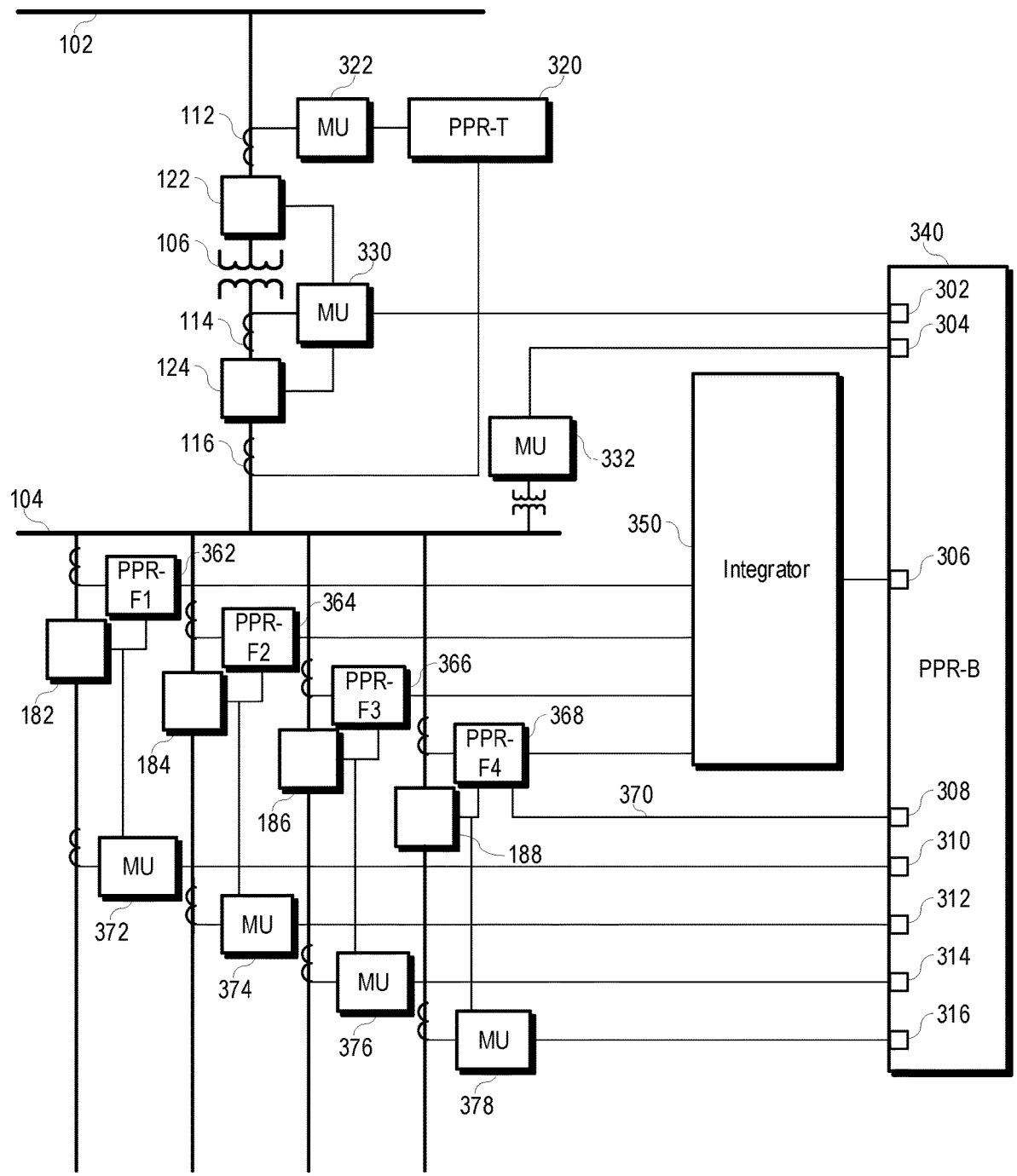
FIG. 3 illustrates a simplified one-line diagram of an electric power delivery system for providing electric power to loads including protection relays and an integration system in accordance with embodiments of the disclosure.

FIG. 3 illustrates a simplified one-line diagram of an electric power delivery system that may be similar to the system illustrated in FIG. 1, including a protection system in accordance with the present disclosure. In particular, the protection system includes various primary protection relays: primary transformer protection relay PPR-T 320, bus relay 340 (e.g., PPR-B), primary feeder protection relays PPR-F1 362, PPR-F2 364, PPR-F3 366, and PPR-F4 368, that do not depend on communication with automation, monitoring, or supervisory systems to continue providing critical protection to the electric power delivery system equipment. Such primary protection relays may be used to separate primary protection functions from other functions traditionally performed by IEDs. Communications among primary protection relays may be facilitated by an integrator 350. Integrator 350 may act as a supervisory system that coordinates operations among a plurality of primary protective relays and other devices. Primary protection relays 320, 340, 362, 364, 366, 368 may obtain power system signals using merging units such as MUs 322, 330, 332, 372, 374, 376, 378; using instrument transformers; or the like.

Feeders from bus 104 may be protected using feeder relays PPR-F1 362, PPR-F2 364, PPR-F3 366, and PPR-F4 368. Feeder relays 362-368 may obtain current signals from respective feeders using CTs and/or merging units such as MUs 372, 374, 376, 378. Feeder relays 362-368 may further obtain voltage signals from the bus using a potential transformer (PT) and/or a merging unit such as MU 332. Using the current and/or voltage signals, the feeder relays 362-368 may determine operating conditions on the respective feeders including, for example: phase overcurrent; ground overcurrent; neutral overcurrent; negative sequence overcurrent; arc flash; overvoltage, undervoltage; directional power; overfrequency; underfrequency; rate-of-change-of-frequency; fault direction; fault distance; and the like. In the event of a condition determined outside of predetermined operating conditions, the feeder relay 362-368 may be configured to send an open or trip command to an associated circuit breaker, thus effecting a protective action on the electric power delivery system.

Feeder relays 362-368 may be in communication with respective circuit breakers 182, 184, 186, 188 as illustrated. In various embodiments, the feeder relays 362-368 may be in direct communication with the circuit breakers 182-188 as illustrated. In various other embodiments, the feeder relays 362-368 may be in communication with the circuit breakers 182-188 via merging units such as MUs 372-378. Accordingly, feeder relays 362-368 may provide protection to the feeders using measurements from the power system, using the measurements in one or more protective elements, and effecting a protective action by commanding a circuit breaker to open.

The protection system may include an integrator 350 in communication with various devices and equipment in the electric power delivery system. The integrator 350 may perform monitoring, automation, supervisory, communication, secondary (non-critical, backup, or the like) protection, and other functions. As illustrated, the primary protection relays (such as, for example, the transformer relay 320 and the feeder relays 362-368) may be in communication with the integrator 350. According to various embodiments, the primary protection relays may transmit digitally sampled values, states, and/or commands to the integrator 350 useful for its monitoring, automation, backup, supervisory, and other functions, and for communication to other primary protection relays. The primary protection relays may transmit such communications in accordance with a predetermined communication protocol. In various embodiments, the protocol includes an identification of the primary protection relay that is sending the communication, and a payload of the predetermined set of signal values, states, and commands. The payload may vary depending on the type of primary protection relay (feeder protection relay, transformer protection relay, bus protection relay, or the like). A user may apply settings to the primary protection relay governing which signal values, states, and commands are transmitted. Primary protection relays may be configured to transmit such communications in accordance with a predetermined schedule. Primary protection relays may continuously send such communications regardless of a change in state or command.

As mentioned above, each primary protection relay may perform protection functions for the equipment monitored thereby with or without communications with the integrator 350, other primary protection relays, or IEDs. For example, the transformer relay PPR-T 320 may perform overcurrent protection, overvoltage protection, undervoltage protection, and differential protection for the transformer 106 using signals obtained from the equipment regardless of communication with the integrator 350 or other devices. Further automation, control, and protection functions may be performed using signals from other primary protection relays or supervisory systems received by transformer relay 320 via the integrator 350. For example, in the case of a breaker failure on one of the feeders, the responsible primary protection relay of the feeder may provide a breaker failure signal to the integrator 350. The integrator 350 may be configured to send breaker failure signals to the bus protection relay 340. Upon receipt of the breaker failure signal, the protective relay 340 may signal MU 330 to open breaker 124 and/or breaker 122, to deenergize the faulted feeder.

The protection system may also include a primary protection relay in the form of a protective relay 340 configured to provide protective functions to the bus 104. Protective relay 340 may be a primary protection relay, as it is capable of obtaining power system measurements and providing protective functions without communication with any monitoring or other supervisory system. Protective relay 340 may obtain electric power system measurements related to electric power entering and leaving the protected bus 104 using CTs, PTs and the like and/or merging units. For example, protection relay 340 may include a number of communication ports 302, 304, 306, 308, 310, 312, 314, 316 for receiving power system signals from various other protection devices and/or merging units. The communication ports 302-316 may facilitate communications on optical media, electrical media, or the like. The communication ports 302-316 may facilitate one-way or bi-directional communication. Current measurements on one side of the bus 104 from merging unit 330, which obtains current signals using CT 114, may be provided to the protection relay 340 via communication port 302.

As illustrated, protective relay 340 obtains current measurement on one side of the bus 104 from merging unit 330, which obtains current signals using CT 114. Voltage measurements may be obtained from merging unit 332, which obtains voltage signals from the bus 104 using a PT. Measurements of current on the other side of the bus 104 may be obtained from merging units 372, 374, 376, 378, which obtain current signals from the feeders using CTs. The protective relay 340 may use the currents and/or voltages to perform various protection functions such as, for example: overcurrent (phase, ground, neutral); breaker failure; time-overcurrent; current differential; undervoltage; overvoltage; and the like. The protective relay 340 may protect a zone of the electric power delivery system such as, for example, the zone between circuit breaker 124 and breakers 182-188. The protective relay 340 may be configured to detect an event using the currents and/or voltages, and send a trip command to one or more circuit breakers to remove power from a portion of the power system affected by the event. For example, the protective relay 340 may determine that a fault is present on bus 104 using current differential protection principles, and command breaker 124 to open (either via direct communication or via merging unit 330) to remove electric power from the faulted bus 104. The protective relay 340 may further command breakers 182-188 to open (either via direct communication or via merging units 372-378) to limit potential backfeed from the feeders into the faulted bus 104.

Similar to the primary protection relays 320 and 362-368, the bus relay 340 may continue providing protective functions to the power system regardless of availability of any integrator, monitoring, automation, or supervisory systems or devices. In various embodiments described herein, the primary protection relays 320, 340, 362-368 may primarily perform protective functions, with secondary functions being removed to a separate device, such as the integrator 350. For example, calculating, time stamping, and time aligning synchrophasors may be unnecessary for protective functions, and thus removed to the integrator. Similarly, many communications functions such as formatting communications to correspond with supervisory protocols may be removed to the integrator.

Some primary protection functions may be performed by a combination of primary protection relays. For this, the system may include some communication between primary protection relays. As illustrated, a dedicated communication pathway 370 is configured between feeder relay 368 and bus relay 340. Although a single communication pathway between one feeder relay and the bus relay is illustrated, several primary protection relays may be in similar communication. The communication may be peer-to-peer, high speed, and operate on optical or electrical media. The communication may operate in accordance with the MirroredBits® protocol available from Schweitzer Engineering Laboratories, Inc. of Pullman, Wash. In certain embodiments, the communication may facilitate primary protection functions such as, for example, transfer trip, blocking, interlocking, permissive schemes, direct control, relay-to-relay communications, or the like. In the illustrated example, the communication 370 may be useful for direct transfer tripping by the bus relay 340 in the event of breaker failure detection by the feeder relay 368. Thus, the bus relay may clear a fault by opening breaker 124 and/or 122 in the event that breaker 188 does not trip.

The integrator 350 may communicate monitoring, automation, and supervisory information to the primary protection relays, and to facilitate communications among the primary protection relays. For example, the integrator 350 may perform breaker failure analysis to determine if a breaker has operated after a signal has been sent to open the breaker. If the integrator 350 determines that the breaker has not opened, it may send a signal to the merging unit and/or to the appropriate primary protection relay to attempt to open the breaker. The integrator 350 may also signal a second breaker to open, where the second breaker is positioned to also remove power from the affected portion of the electric power delivery system. For example, upon failure of breaker 182, the integrator 350 may signal for breaker 122 or 124 to open, removing power from the bus 104 and related feeders.

The integrator 350 may further be configured to send specified communications from certain primary protection relays to appropriate receiving primary protection relays. For example, bus 104 voltage measurements from the primary bus protection relay 340 may be useful for certain protection operations of the feeder protection relays 362-368. Accordingly, the integrator 350 may be configured to send bus voltage measurements from protection relay 340 to each of the feeder protection relays 362-368 by routing such voltage measurements to the communications ports associated with each of the feeder protection relays 362-368.

Communications between the primary protection relays and the integrator may be bi-directional. In various embodiments, the integrator 350 may include multiple communications ports, each associated with a different primary protection relay. Each communications channel may be synchronous or asynchronous. Each communications channel may be deterministic such that communications among primary protection devices is deterministic. With different communication ports in communication with different primary protection relays, the integrator 350 may be easily configured to route specific communications among different primary protection relays by simply routing the communications between different communication ports.

Communications between the various merging units and primary protection relays may be bi-directional. For example, the merging units may send signals related to electric power system measurements and equipment status using a predetermined protocol. Primary protection relays may send commands to the connected merging units (such as open, close, step up, step down, and the like) using the predetermined protocol. The merging units signal primary equipment in accordance with the received commands.

Figure 4:
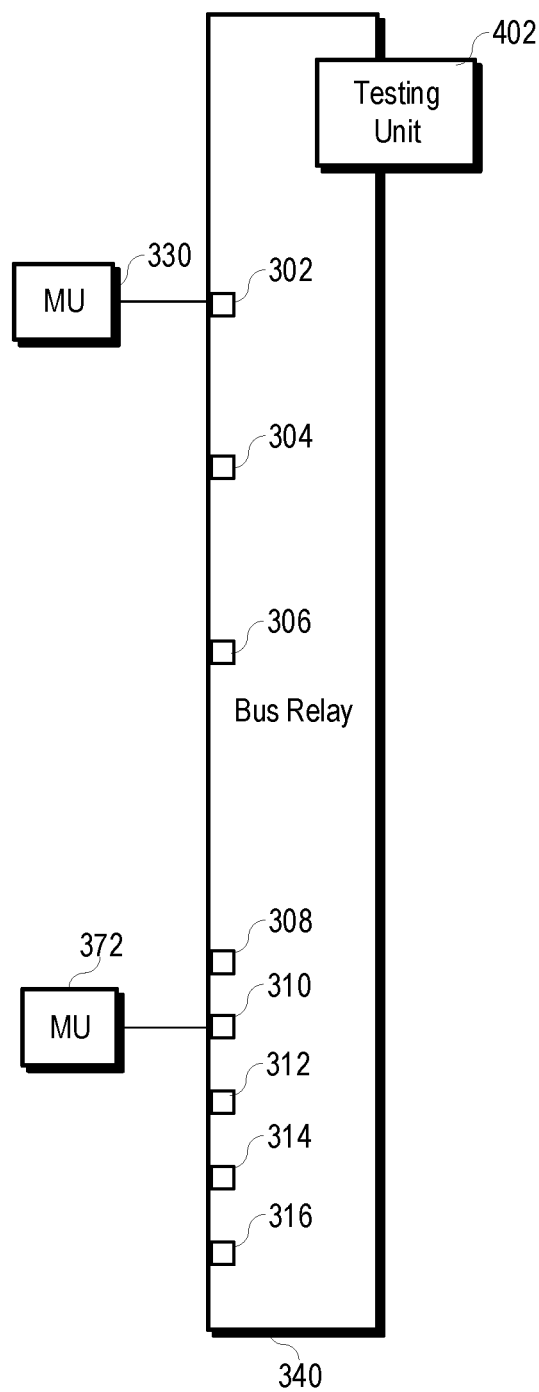
FIG. 4 illustrates a block diagram of a system for commissioning and/or testing the protection relay of FIG. 3 in accordance with embodiments of the disclosure.

FIG. 4 illustrates a block diagram of a system for testing a bus relay 340. The system includes a testing unit 402 associated with a controller (not shown), for transmitting test signals to one or more merging units 330, 372 via bus relay 340. In some embodiments, the testing unit 402 may be part of or separate from the protection relay 340. The testing unit 402 may provide signals similar to those typically provided by the merging units 330, 372 via the protection relay 340. The merging units 330, 372 may receive a test data stream from the testing unit and route the test data stream back to the protective relay 340. However, because the merging units 330, 372 may be located remotely from each other, the protection relay 340 may be used to route the signals to the merging units 330, 372 for looping back the test signals to test the protective relay 340. In various embodiments, the test data stream is substantially unmodified by the merging units 330, 372.

Figure 5:
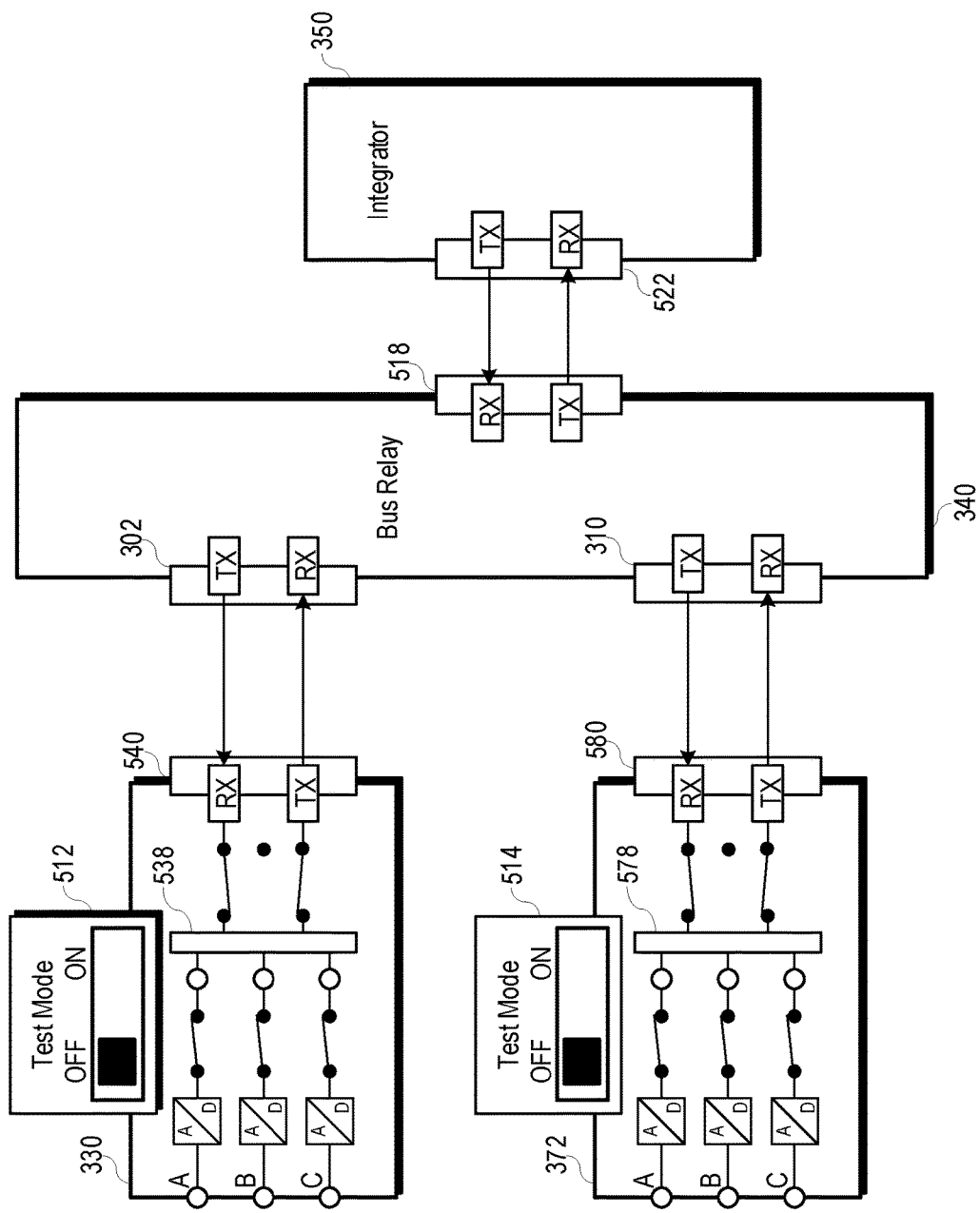
FIG. 5 illustrates a block diagram of a system for testing a protection relay in accordance with embodiments of the disclosure.

FIG. 5 illustrates a functional block diagram of a system for protection of an electric power delivery system capable of loopback testing in accordance with several embodiments herein. The system as illustrated is in non-testing mode for normal operation of the protection system. The system includes an integrator 350 in communication with a primary protective relay 340. The bus relay 340 may obtain digitized analog electric power system signals using merging units 330 and 372. Merging units 330 and 372 may obtain signals from the electric power delivery system (such as, for example, currents and/or voltages), as well as status information from power system equipment (e.g., circuit breaker open/closed), and provide control signals to power system equipment (e.g., open/close signals). The merging units 330, 372 obtain signals from three phases A, B, C of the electric power delivery system. The merging units 330, 372 may include analog-to-digital converter(s) (A/D) for sampling and digitizing the power system signals and providing the digitized analog signals to a communications module 538, 578. The communications module 538, 578 may format the digitized analog signals for communication to the primary protective relay 340. For example, the communications module 538, 578 may serialize the digitized signals and convert the information into a protocol for transmission to the bus relay 340. The signals may be transmitted to the bus relay 340 using a communication media that allows for two-way communication. In some embodiments, the communication media may be optical. The merging units 330, 372 may include communication ports 540, 580 including portions (physical or logical) for receiving RX and transmitting TX communications on the media.

Each of the merging units may include a test mode switch 512, 514 for selecting between a normal operating mode and a testing mode. The test mode switches 512, 514 may be physical or logical. In various embodiments, the test mode switches 512, 514 may be embodied as dip switches, slider switches, pushbuttons or the like. In various embodiments, the test mode switches 512, 514 may be operable via remote HMI using, for example, the primary protective relay 340, a connected HMI device, or the like. Under normal operating mode, digitized analog power system signals are provided to the communications modules 538, 578, and sent to the primary protective relay 340 using the communication ports 540, 580. The merging units may include a series of switches (physical or logical) to facilitate such transmission of signals.

Figure 6:
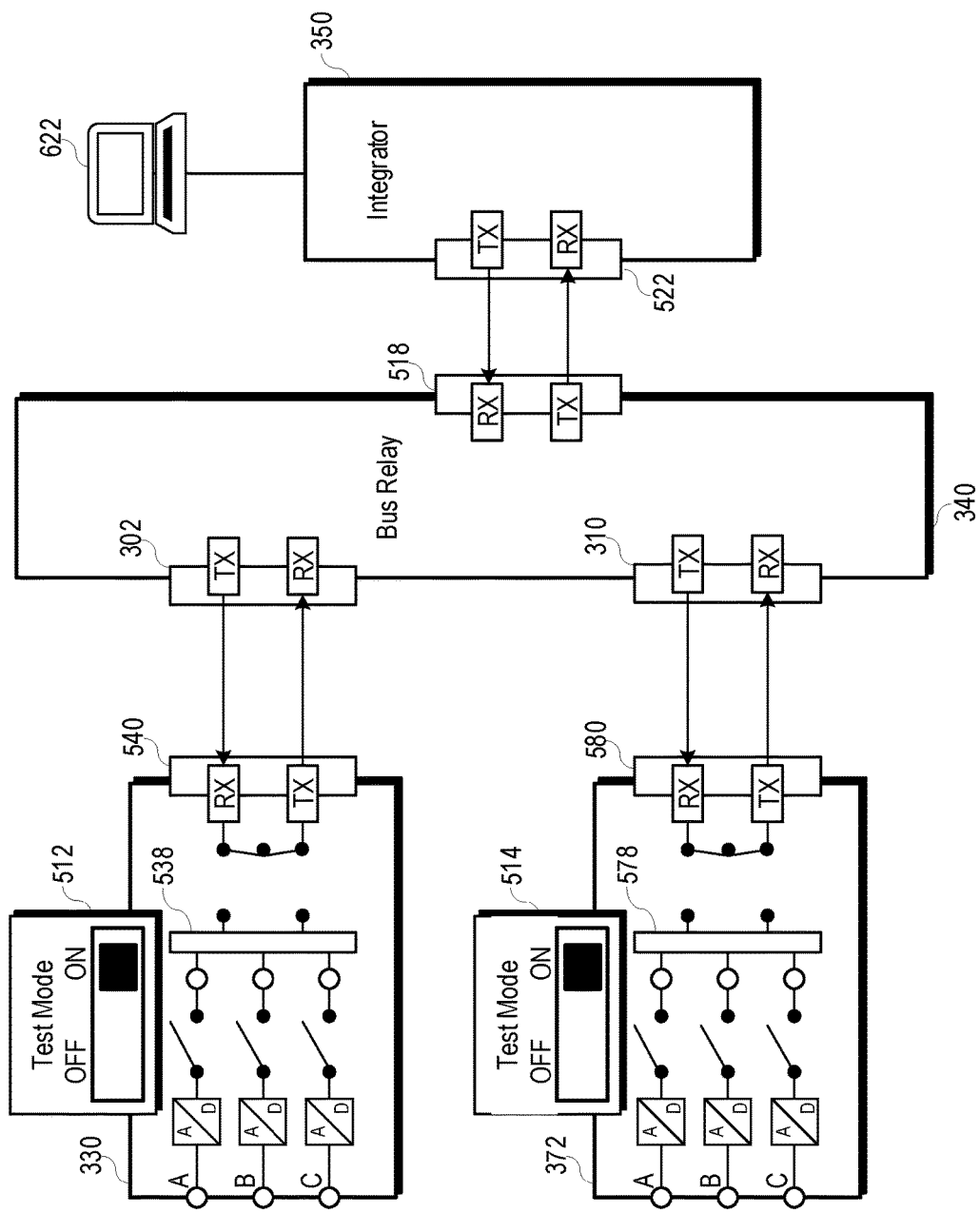
FIG. 6 illustrates a simplified block diagram for testing a primary bus protection relay in accordance with embodiments of the disclosure.

FIG. 6 illustrates a functional block diagram of the system for protection of an electric power delivery system of FIG. 5, configured in test mode for loopback testing in accordance with several embodiments herein. The merging units 330, 372 may be reconfigured into the testing mode via the test mode switches 512, 514. Upon entering testing mode, the merging units reconfigure internal switches (physical or logical) such that digitized analog signals from the power system are not provided to communications port 540, 580. Instead, the receive and transmit interfaces of the communications 540, 580 are connected or looped back such that communications received on the receive interfaces are looped back or retransmitted to the primary protective relay 340.

In the test mode, the merging units 330, 372 receive an input stream of test data from the protective relay 340 that can be routed back to protective relay 340. In some embodiments, a loop back refers to a re-routing of the data streams back to the source with minimal to no modification of the data stream. In the illustrated embodiment, the data streams are digital and can be transmitted at fixed or varying intervals. This can work over various communication media connecting the merging units 330, 372 and the protective relay 340. Such an approach simplifies the testing and commissioning of the protection relay 340 functions.

Switching a merging unit 330, 372 into test mode reconfigures the merging unit 330, 372 to loop back communications and not transmit the digitized analog signals from the power system (now shown) to the bus relay 340. The merging unit 330, 372 may be configured to send a communication to the protective relay 340 that the merging unit 330, 372 has been reconfigured into testing mode. The communication may be enabling or disabling a test mode bit embedded within the data stream in accordance with a predetermined communication protocol. The protective relay 340 may be configured such that if any of the merging units 330, 372 connected thereto are in testing mode, the protective relay 340 will signal to the integrator 350 and other connected devices that the merging units 330, 372 are in test mode. The protective relay 340 may switch into a testing mode.

The protection relay 340 may include a test file that includes one or more test data streams to transmit to the merging units for loop back. The protective relay 340 may synchronously send the data streams to multiple merging units 330, 372 as needed for testing. For example, the protective relay 340 may be configured for current differential protection. Accordingly, two test data streams may be synchronously transmitted to two merging units 330, 372 for loopback. Upon receipt, the protective relay 340 may treat the looped back data streams as if they were digitized analog signals from multiple points on a power system, and perform its current differential protection processes using the looped back data streams. In other embodiments, the protection element under test may only require data from a single merging unit. Accordingly, the test data would be streamed to a single merging unit 330, 372 for loop back to the protective relay 340. In other embodiments, the protection element under test may require data from several merging units 330, 372. Accordingly, the test data would be streamed to the multiple merging units 330, 372 synchronously for loop back to the protective relay 340. In any embodiment, the protective relay 340 may perform the protection element using the data looped back to the protective relay 340 from the merging unit(s) 330, 372.

The protective relay 340 may be pre-loaded with one or more test files that are user selectable. The protective relay 340 may allow a user to modify existing test files and/or enter new test files. The protective relay 340 may be in communication with an integrator 350 via communications ports 518 and 522 allowing for bi-directional communication with the integrator. The integrator 350 may be pre-loaded with one or more test files that are user selectable for transmission to the protective relay 340. The integrator 350 may allow a user to modify existing test files and/or enter new test files. The integrator 350 may be in communication with a separate user interface 622 (such as a handheld HMI, laptop computer, or the like) that includes test files for transmission to the integrator or allows users to enter or modify test files. In various embodiments, the integrator 350 transfers the test files to the protective relay 340, and the protective relay 340 performs the test by streaming the data of the test files to the merging unit(s) for loop back to the protective relay 340. In various other embodiments, the integrator 350 streams the data of the test files to the protective relay 340, which in turn streams the data to the merging unit(s) for loopback to the protective relay 340.

The test files may include data to stream for loopback. The test data streams may be generated by the protective relay 340, the integrator 350, and/or the separate user interface 622. The test files may include digitized analog signals recorded from field events, recorded from a test set, generated using a test set, or the like. The test files may be recorded in a format used by IED testing such as, for example, a COMTRADE test file or the like.

Figure 7:
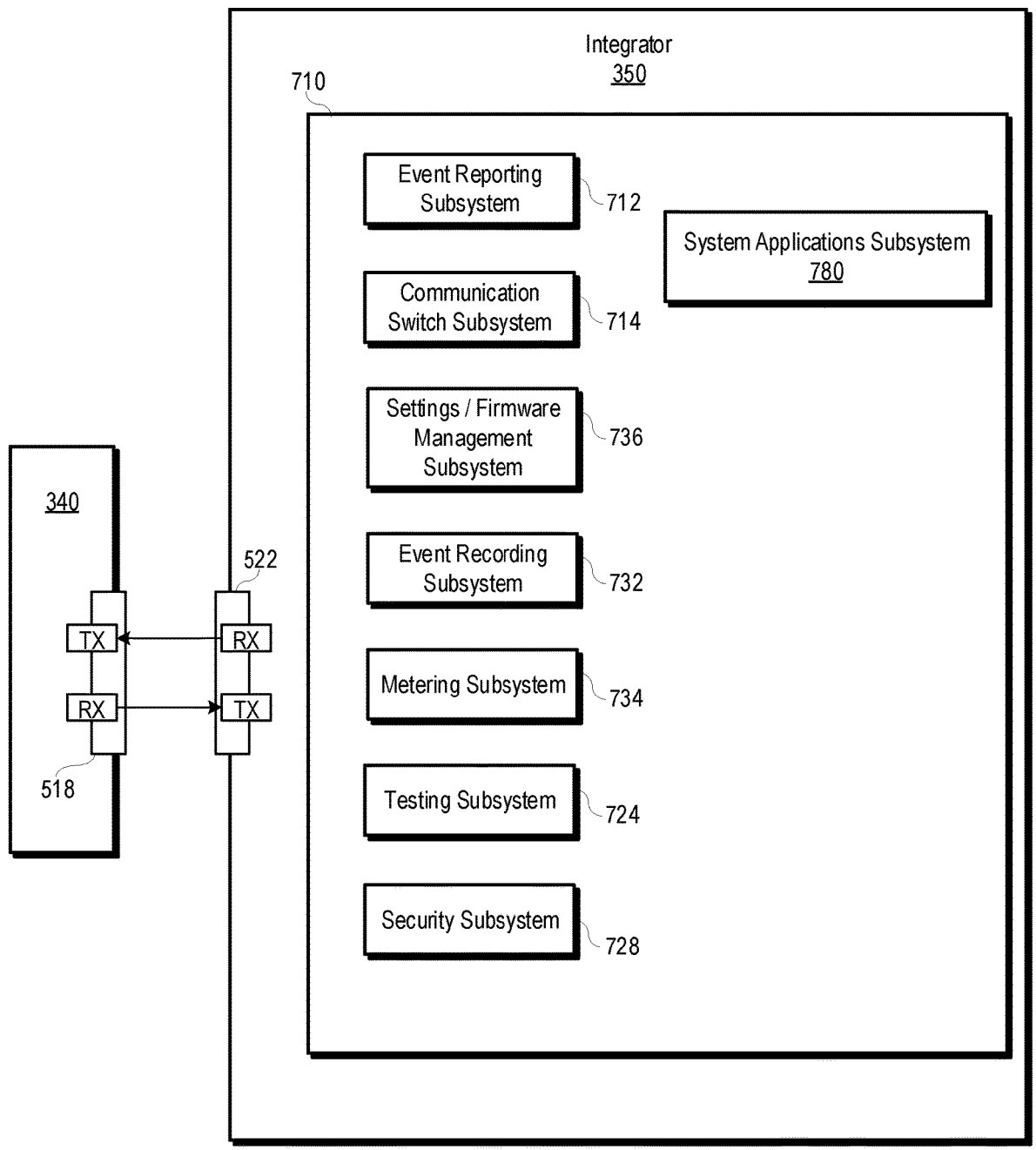
FIG. 7 illustrates a simplified block diagram of an integrator for use in testing a primary bus protection relay in accordance with embodiments of the disclosure.

FIG. 7 illustrates a simplified block diagram of an integrator 350 in accordance with several embodiments herein. The integrator 350 is in communication with a protective relay 340 via communications media in communication with ports 518 and 522, which facilitate bi-directional communication. The integrator 350 may operate in accordance with architecture of a computing device, including a processing device (microprocessor, processor, field-programmable gate array (FPGA), application-specific integrated circuit (ASIC), or the like) for executing computer instructions stored on a tangible computer-readable storage media 710. The media may be packaged together with the processing device, physically separate from the processing device, or spread across multiple physical media.

The storage media 710 may include several elements or groups of computer instructions causing the integrator to perform certain functions. For example, the elements may include system applications subsystem 780 such as protection backup for protection devices, coordination of protection devices, other system protection operations, and the like. Event recording subsystem 732 and event reporting subsystem 712 function together to compile information about power system events from multiple connected primary protection relays and from the integrator for communication to a supervisory system or later retrieval. Communication switch subsystem 714 may facilitate communication of digitized analog signals and other information among connected primary protection relays and among connected integrators. Settings/firmware management subsystem 736 may keep records of settings and firmware versions of connected primary protection relays, and perform upgrades and settings changes as needed. Metering subsystem 734 may perform metering operations on the electric power delivery system using digitized analog signals and other information from the connected primary protection relays. Security subsystem 728 may monitor for security breaches, and disconnect communications with the primary protection relays in the event of a detected security breach or a notification (e.g., via communications or physical input) of a security breach such that the primary protection operations may continue even during a security breach.

The testing element or subsystem 724 may perform the testing procedures as described herein. These procedures may include receiving, recording, and modifying test files; when in testing mode, sending the set files to the primary protection devices; receiving and recording results of testing from the primary protection devices; and transmitting and/or displaying the results; and ending test mode. In various embodiments, the testing subsystem 724 of the integrator 350 may take the test file (such as a COMTRADE test file) and parse the streams for playback from different merging units. The testing subsystem 724 may allow time aligned playback from the merging unit(s) using predetermined time coordinated instructions. The predetermined time coordinated instructions may be formatted as a series of steps or instructions directed to each merging unit. The steps or instructions may include coordinated time stamps for initiation of streaming of the data and/or for streaming of the event data within the data streams. The steps or instructions may include local device checks to ensure that no alarms are present, that a start command has been issued to execute the steps or instructions, and other similar checks to ensure that automated streams of data are not sent at inappropriate times.

After execution of the test (e.g., streaming data from the primary protection relay to the merging unit(s), execution of protection elements of the protective relay 340 on the test data, and the protective relay 340 sending the integrator 350 the data and any decided actions), the testing subsystem 724 may record the results of the test for display, communication, and/or later retrieval. The integrator 350 may signal the protective relay 340 to exit testing mode. The protective relay 340 may signal the merging unit(s) to revert to normal mode (exit testing mode) such that digitized analog signals from the power system are streamed by the merging units to the protective relay 340. In various embodiments, the protective relay 340 may wait for the merging units to indicate that they have exited test mode before the protective relay 340 also exits test mode.

In various embodiments, the test data may be streamed from the integrator to the primary protection relay under test. In various other embodiments, the test file and/or instructions are sent from the integrator to the primary protection relay under test.

Figure 8:
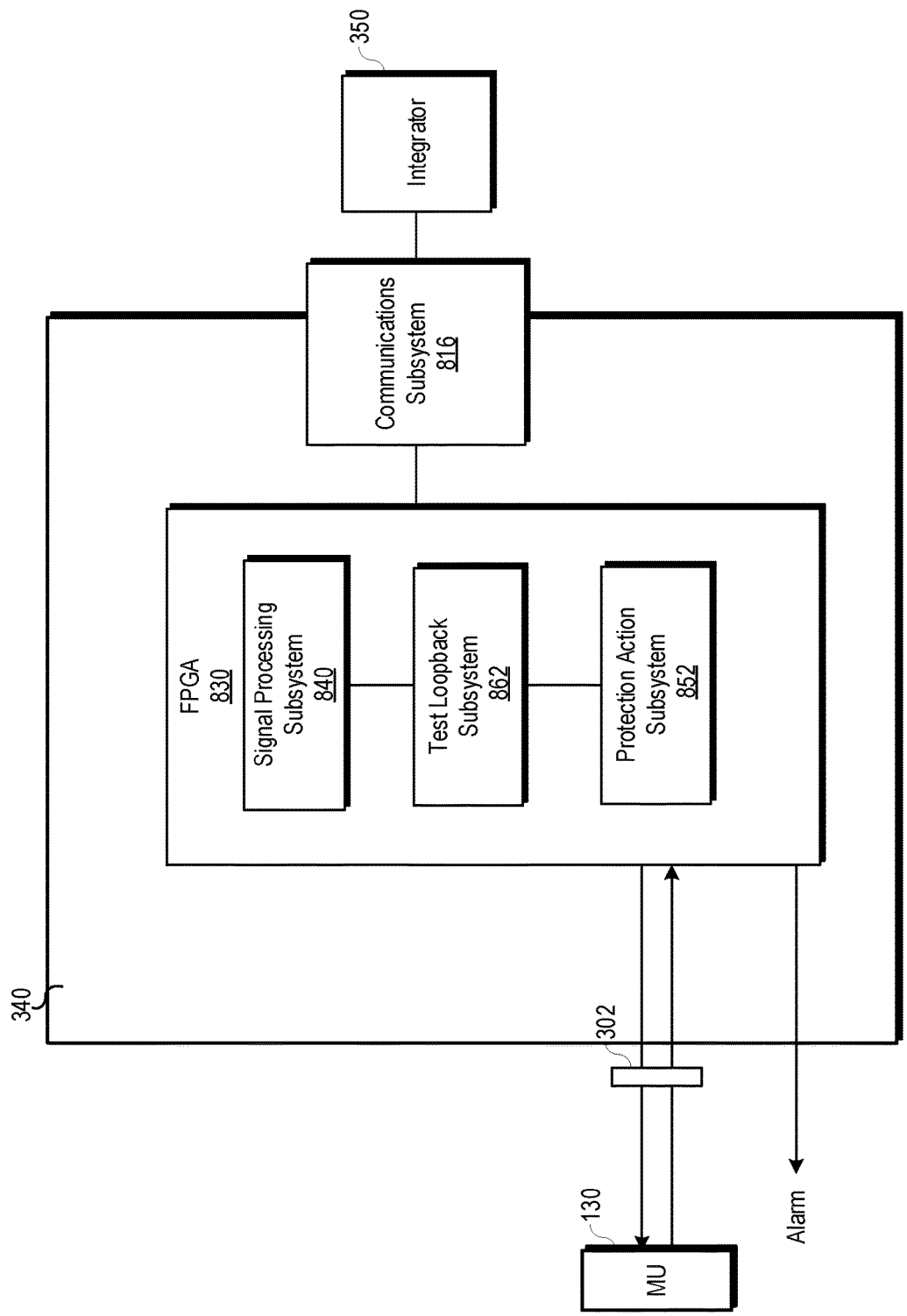
FIG. 8 illustrates a simplified block diagram of a primary bus protection relay in accordance with embodiments of the disclosure.

FIG. 8 illustrates a simplified block diagram of a protective relay 340 in accordance with some embodiments herein that may operate in testing mode. The protective relay 340 may include a controller such as a field-programmable gate array (FPGA) 830 for storing and executing computer instructions causing the protective relay 340 to perform protection and testing functions as described herein. It should be noted that the protective relay 340 may include one or more controllers that execute one or more of the various computer instructions described herein. In various embodiments, certain protection elements are performed using the FPGA, and additional instructions such as communications may be performed using a processor. The protective relay 340 may include additional computer storage (packaged with and/or separate from the FPGA 830) for storage of information, test files, further computer instructions, and the like. The FPGA 830 may execute functions such as signal processing subsystem 840 to format received digitized analog signals for use by the various protection functions of the protective relay 340. The signal processing subsystem 840 may include resampling, filtering, and the like. The protection action subsystem 852 may include the primary protection functions of the primary protection relay including elements such as current differential, overcurrent, undervoltage, transformer differential, directional, traveling wave fault, time-domain fault, overfrequency, underfrequency, rate-of-change-of frequency, and the like.

The functions may include test loopback subsystem 862 which may be executed when the protective relay 340 is in test mode. As described in more detail above, when in test mode, the test loopback subsystem 862 may cause the primary protection relay to stream test data from a test file (which may be streamed from the integrator 350 over communications subsystem 816 or stored in the protective relay 340) to the associated merging unit 130 (or merging units). The merging unit may loop the data back to the protective relay 340 for processing in signal processing subsystem 840 and execution of the protection action subsystem 852 on the test data. The test data and results of protection actions may be sent back to the integrator 350 using communications subsystem 816. The test loopback subsystem 862 may perform certain checks before executing a test such as, for example, determining that the merging unit 130 is in testing mode, time aligning data streams, transmitting data streams, and the like. The test loopback subsystem 862 may cause the protective relay 340 to enter test mode (e.g., automatically, without user input) whenever any of the associated merging units 130 are in test mode (indicated using communications from the merging unit).

Upon execution of the test, the results may be examined to ensure that the primary protection relay is operating as expected. The evaluation may be performed by a user accessing the results using the integrator 350, controller 622, and/or the protective relay 340. The testing may be performed at setting time of the primary protection relay, at commissioning, upon changes in settings or firmware upgrades, upon modification of protected equipment, or the like.

Accordingly, presented herein are various embodiments of testing a primary protection relay. The testing may not require the vast amounts of testing equipment or setup in a substation required by previous testing systems. The testing may include loop back of test data using merging units in test mode.

Figure 9:
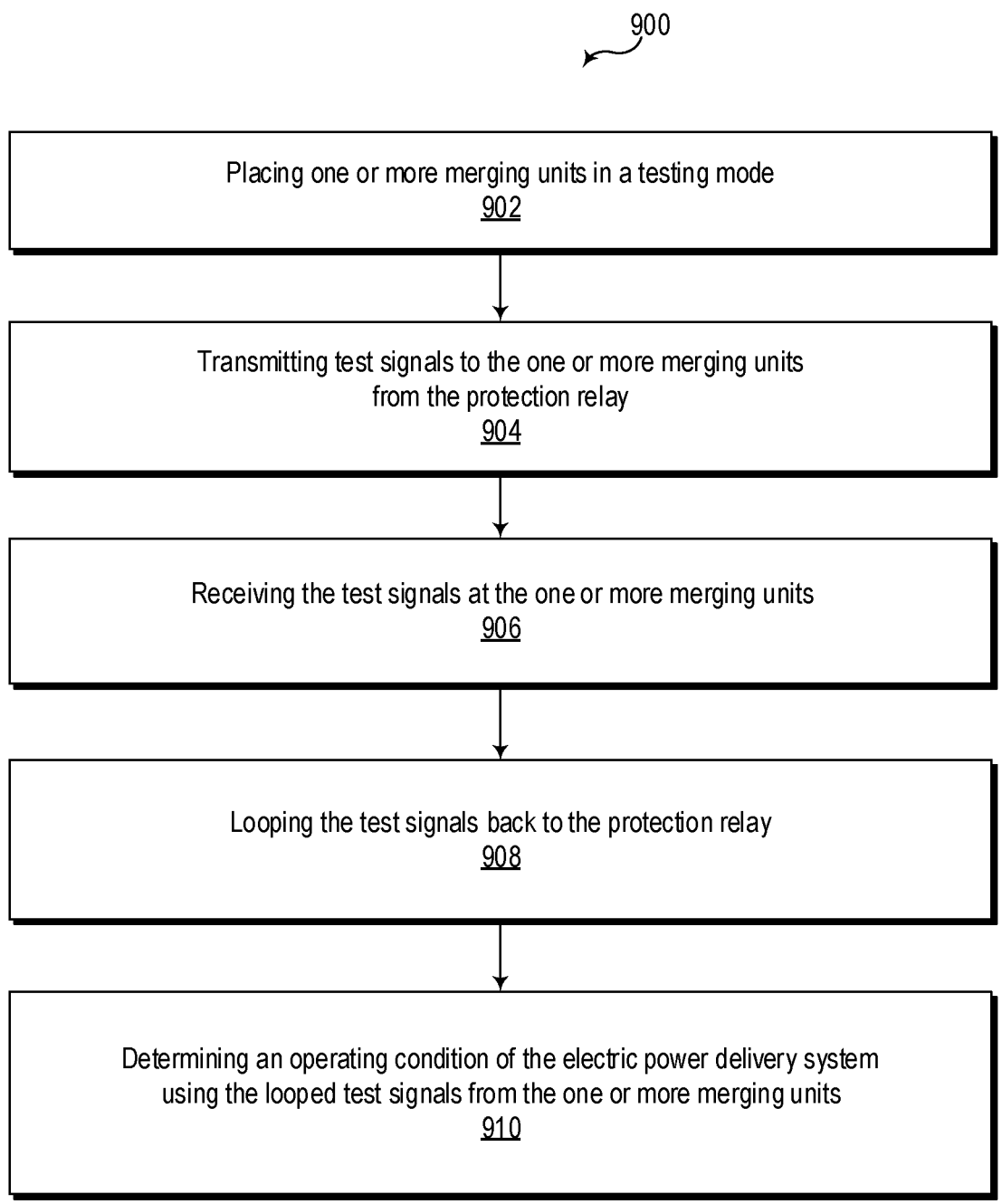
FIG. 9 illustrates a flow chart of a method of testing a protection relay of an electric power delivery system in accordance with embodiments of the disclosure.

FIG. 9 illustrates a flow chart of a method 900 of testing a protection relay of an electric power delivery system.

At 902, one or more merging units may be placed in a testing mode. For example, a physical or virtual switch may be altered (e.g., toggled) to a test position.

At 904, test signals may be transmitted to the one or more merging units from the protection relay.

At 906, the test signals may be received at the one or more merging units. In some embodiments, each merging unit may receive a unique test signal (e.g., sub-test signals) individually or as part of the overall test signal packet.

At 908, the test signals may be loop back to the protection relay (e.g., after being modified or only passed through the merging units).

At 910, an operating condition of the electric power delivery system may be determined using the looped test signals from the one or more merging units. The operating condition may be verified against an expected condition to ensure that the device being tested functions as expected.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to test a primary protection relay of an electric power delivery system, comprising:
   a first merging unit, comprising:
   a communication subsystem, comprising:
   a monitored equipment interface to receive information from monitored equipment; and
   a relay interface, comprising:
   a first port to receive information from a protective relay; and
   a second port to transmit information to the protective relay;
   a test mode selection subsystem to allow a user to select one of an operating mode and a testing mode; and
   a routing subsystem to route information from the monitored equipment interface through the first merging unit and to the relay interface in the operating mode, and to route a test data stream provided via the protective relay from the first port to the second port in the testing mode while bypassing the monitored equipment interface to provide a signal in response to the test data stream back to the protective relay;
   a protective relay, comprising:
   a protective relay communication subsystem in communication with the relay interface; and
   a protective action subsystem to perform at least one protective action in response to the test data stream; and
   a supervisory unit, comprising:
   a testing unit to produce the test data stream; and
   a supervisory unit communication subsystem in communication with the primary protective relay.

2. The system of claim 1, wherein the protective relay is to communicate the protective action to the testing unit.

3. The system of claim 1, wherein the test data stream comprises a plurality of time-aligned instructions.

4. The system of claim 3, further comprising a second merging unit, and wherein the first merging unit and the second merging unit are to each execute a subset of the plurality of time-aligned instructions at predetermined times specified by the plurality of time-aligned instructions.

5. The system of claim 1, wherein the test mode selection subsystem comprises at least one of a physical input or a logical input to allow a user to select one of the operating mode and the testing mode.

6. The system of claim 1, wherein the test data stream passes from the first port to the second port substantially unmodified by the merging unit.

7. The system of claim 1, wherein the supervisory system is further to parse a testing file to identify a plurality of instructions to communicate to the merging unit and to generate the test data stream based on the testing file.

8. The system of claim 1, wherein the test data stream is to be communicated from the merging unit to the protective relay via a communication link utilized in the operating mode.

9. A method of testing a protection relay of an electric power delivery system, the method comprising:
   placing one or more merging units in a normal mode;
   in the normal mode, receiving signals from the electric power delivery system at a communication subsystem of the one or more merging units and transmitting the signals to the protective relay;
   placing the one or more merging units in a testing mode;
   transmitting test signals provided by a supervisory unit to the one or more merging units from the protection relay;
   receiving the test signals at the communication subsystem of the one or more merging units;
   in the testing mode, looping the test signals through the communication subsystem from a first port to receive information from the protective relay and back to the protection relay through a second port to transmit information to the protective relay; and
   determining an operating condition of the electric power delivery system using the looped test signals from the one or more merging units.

10. The method of claim 9, further comprising receiving a testing file from the supervisory unit to generate the test signals with the protection relay.

11. The method of claim 9, further comprising providing individual test signals to multiple merging units of the one or more merging units.

12. The method of claim 9, further comprising automatically entering into a test mode with the protection relay when receiving the looped test signals form the one or more merging units.

13. The method of claim 12, further comprising verifying if the one or more merging units are in the testing mode with the protection relay.

\* \* \* \* \*